United States Patent [19]

Ivett et al.

[11] 4,023,725

[45] May 17, 1977

[54] SEMICONDUCTOR DEVICE MANUFACTURE

[75] Inventors: Peter Robert Ivett, Southampton; Christopher Tooth, Cornwall; Leslie Charles Davis, Southampton, all of England

[73] Assignee: U.S. Philips Corporation, New York, N.Y.

[22] Filed: Mar. 3, 1975

[21] Appl. No.: 554,969

[30] Foreign Application Priority Data

Mar. 4, 1974 United Kingdom .............. 9689/74

[52] U.S. Cl. .............................. 228/123; 228/124; 228/208

[51] Int. Cl.² ...................... B23K 1/02; H01L 21/58

[58] Field of Search .......... 228/123, 122, 124, 179, 228/208, 263

[56] References Cited

UNITED STATES PATENTS 3,339,267  9/1967  Bronnes et al. ................... 228/124

*Primary Examiner*—Al Lawrence Smith
*Assistant Examiner*—K. J. Ramsey
*Attorney, Agent, or Firm*—Frank R. Trifari; Ronald L. Drumheller

[57] ABSTRACT

A method of bonding a semiconductor body to a supporting member where the whole back face of the semiconductor body is covered with a thin evaporated layer of chromium or titanium, which layer is then covered with a thin evaporated layer of rhodium, platinum or palladium, which is in turn bonded by a film of solder to the supporting member.

10 Claims, 4 Drawing Figures

SEMICONDUCTOR DEVICE MANUFACTURE

THIS INVENTION relates to methods of manufacturing a semiconductor device comprising a semiconductor body mounted on a supporting member, for example a lead-comb or a header, the back face of the semiconductor body facing the supporting member being metallized and secured to the supporting member by a solder film.

Our British Patent No. 1,331,980 (PHB 32111) disclosed a method of securing a semiconductor body on a support by so-called "capillary flow soldering". In this method the semiconductor body and at least one body of solder material are located beside each other in non-overlapping relationship at a surface of the support. The support and bodies are then heated to a temperature in excess of the melting point of the solder material for a time sufficient to cause flow of solder material on the surface of the support and by capillary action between the facing surfaces of the semiconductor body and support to form an intermediate solder film between these facing surfaces. This solder film on cooling secures the semiconductor body to the support. Advantages of such a method of capillary flow soldering of semiconductor bodies to supports are described in detail in this British Patent Specification.

The back face of the semiconductor body facing the support is metallized. In the specific embodiment described with reference to the drawings a conventional back metallization of silver on titanium is described. Both the silver and titanium are deposited by evaporation. The silver is an order of magnitude thicker than the titanium, for example 1 micron of silver on 0.1 micron of titanium. Such conventional silver-titanium metallization is advantageous in not requiring the semiconductor body to be heated to high temperatures such as are necessary for, for example, conventional sintered nickel back-metallization (heating to approximately 700° C). Such advantages arise from depositing on the semiconductor back face an active metal such as titanium which adheres well to the semiconductor material, possibly via a thin silica film formed naturally on a silicon semiconductor surface on exposure to air at room temperature. However, since such metals as titanium readily oxidize and are not readily solderable, a thicker outer layer of silver or gold or even possibly nickel is provided on the titanium.

The Applicants have found that when soldering to a support such a body having a back-metallization consisting of silver, gold or nickel on an active metal a dynamic metallic system arises and various intermetallics can be formed, resulting in a less reliable contact. There is a tendency for the outer layer of silver, gold or nickel to dissolve locally in the solder, so that dewetting of the solder may occur at the edges of the semiconductor body and a puddle of solder may form at the centre of the body. To reduce this tendency for local removal of the outer layer of back-metallization the thickness of this outer layer should be large. However, such a thick outer layer of silver, gold or nickel is costly and increases the strain on the crystal lattice of the semiconductor body. The applicants have also found the adherence of the silver to the underlying titanium is not always satisfactory in that peeling of the silver from the titanium can occur. In addition an undesirable high contact resistance can sometimes be formed for the back-metallization when the titanium is deposited on low-doped n-type silicon material.

Published Dutch Patent Application No. 7208027 discloses a method of securing a semiconductor body to a support by pressure bonding. In a specific embodiment the semiconductor body is pressure bonded to a header via a soft solder foil placed between the back face of the semiconductor body and the header. The semiconductor body has a conventional back-metallization of a thick layer of silver on titanium as described in the penultimate paragraph. In this case, the titanium is 0.05 microns thick and the silver 0.5 microns thick. The solder adhering to the silver-titanium back metallization constitutes a dynamic metallic system, and the cost of the thick silver layer increases the cost of the device.

According to a first aspect of the present invention there is provided a method of manufacturing a semiconductor device comprising a semiconductor body mounted on a supporting member, the back face of the semiconductor body facing the supporting member being secured thereto, which method includes the steps of:

a. metallizing the whole of the back face of the semiconductor body to form an ohmic contact with the semiconductor at this face by evaporating a first layer comprising chromium or titanium to adhere to the semiconductor and evaporating an outer layer comprising rhodium, platinum, or palladium to adhere to the chronium or titanium, this outer layer being not significantly thicker than the first layer, and thereafter b. locating the semiconductor body on the supporting member and securing the back face of the semiconductor body to the supporting member by a solder film which adheres to the said outer layer to make electrical and thermal connection over the whole metallized back face of the semiconductor body.

It is a surprising feature of this method that the outer layer of the back-metallization is not significantly thicker than the layer of chromium or titanium forming the first layer. Indeed the layer of rhodium, platinum, or palladium can be considerably thinner than the chromium or titanium. By way of contrast in the conventional back-metallization systems described hereinbefore the outer layer of gold, silver or nickel is generally an order of magnitude thicker than the titanium layer. Because of the low solubility of rhodium, platinum, and palladium in solder materials a more stable metallic system results, the thickness of the said outer layer can be small so reducing both strain in the crystal lattice of the semiconductor body and the cost of the devices manufactured, and problems of solder dewetting and puddling are also reduced.

Excellent results have been achieved when rhodium is deposited to a thickness of less than 0.1 micron to form this outer layer of the metallization. Preferably the first layer of the metallization is chromium deposited to a thickness of at most 0.5 micron. The Applicants have found that chromium can be more easily evaporated than titanium, that evaporated rhodium adheres well to chromium, and that contact resistance problems between chromium and both n-type and p-type silicon are negligible. Thus, good reproducibility can be obtained when using a back-metallization consisting of a thin layer of rhodium on a layer of chromium.

It should be noted that it is already known to use rhodium on chromium in the context of some types of multi-layer electrode connections at the front face of a semiconductor body. In this connection reference is invited to U.S. Pat. No. 3,290,127. The rhodium layer is provided to be at least one order of magnitude thicker than the chromium layer, and generally the rhodium does not form an outer layer of the electrode connection, but is coated with a thick layer of silver and/or gold. Above all, it will readily be appreciated by those skilled in the art that generally the problems and solutions associated with front electrode connections have little relevance to the problems and solutions associated with securing a semiconductor body to a supporting member on which it is mounted so as to make efficient electrical, thermal and mechanical connection to the whole back face of the semiconductor body. Thus, front electrode connections generally are provided only locally at the front face of the semiconductor body, for example at a window in an insulating layer, and are contacted by a lead the area of contact of which is considerably smaller than the area of the front face of the body. Such a lead is generally a wire ultrasonically or thermocompression bonded to the electrode connection. It may however be a metal contact member held in pressure contact with the electrode connection as described in said U.S. Patent. In the case of back-metallization, however, both the metallization contacting the semiconductor and the connection area with the supporting member extend across the whole of the back face of the body, and problems to be considered are those of satisfactorily supporting the body, providing adequate thermal conduction from the body, avoiding excess crystal lattice strain in the body, and providing a suitable metallic system for reliable interfacing with for example solder material by which the metallized back face of the body is secured to the supporting member.

According to a second aspect of the present invention a semiconductor device comprises a semiconductor body, a supporting member on which the semiconductor body is mounted, the whole of the back face of the semiconductor body facing the supporting member being metallized to form an ohmic contact with the semiconductor at this face, and a film of solder between the supporting member and the said metallized back face, by which solder film the semiconductor body is secured to the supporting member and electrical and thermal connection is made over the metallized back face of the semiconductor body, the metallization at the back face of the semiconductor body comprising a first portion comprising chromium or titanium which is adherent to the semiconductor and has thereon a second portion comprising rhodium, platinum, or palladium to which the solder is adherent, the second portion of the metallization being not significantly thicker than the first portion.

Both in such devices and in such methods in accordance with the present invention the solder film may be formed using one of a range of soft solder materials having a melting point below 330° C. Such a solder material may have lead as the main constituent and a melting point in the range 295° C to 327° C. Other solder material may be used for example having tin as the main constituent.

In one form the semiconductor body is soldered to the supporting member by heating to above the melting point of the solder material. In another form the semiconductor body is pressure bonded to the supporting member at a temperature below the melting point of the solder material.

The supporting member may be both electrically and thermally conductive and the solder film may form both an electrical and thermal connection between the semiconductor body and the supporting member. Such a conductive supporting member may be, for example, a lead-frame. However, the supporting member may be electrically insulating, for example a ceramic substrate such as beryllia or alumina which has metallization on its upper face facing the semiconductor body to make electrical connection via the solder film to the metallized back face of the semiconductor body. Such a ceramic substrate may be thermally conductive and provide a heat-sink thermally connected to the semiconductor body by the solder film.

Embodiments of various aspects of the present invention will now be described, by way of example, with reference to the accompanying drawing, in which.

Figure 1:
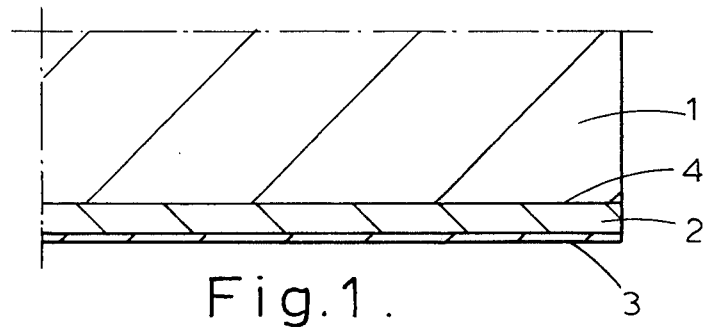
FIG. 1 is a cross-sectional view of part of the lower portion of a semiconductor body of a semiconductor device, showing two layers of back-metallization.

Semiconductor body 1 of which part is shown in FIG. 1 is part of a monocrystalline silicon wafer at the front surface of which semiconductor device elements have been formed in a conventional manner for example by epitaxy and localized doping. As is usual a large number of such device elements are formed simultaneously in the same wafer and after metallization the wafer is divided into individual semiconductor bodies 1. Typical dimensions for each individual body 1 are front and back faces of 1.6 mm. × 2 mm. and a thickness of 150 microns.

As is shown in FIG. 1 two layers 2 and 3 of metallization are provided on the back face 4 of the body 1. The first layer 2 is of chromium or titanium and adheres to the silicon. The outer layer 3 which is thinner than the layer 2 is of rhodium, platinum, or palladium and adheres to the layer 2. Preferably, the first layer is of chromium deposited to a thickness of at most 0.5 micron, and the second, outer layer is of rhodium or platinum deposited to a thickness of less than 0.5 micron, for example less than 0.1 micron.

The deposition of the two layers of back metallization (2,3) may be effected as follows. The back face 4 of the semiconductor wafer is cleaned. The wafer is placed in an evaporation chamber at a pressure of, for example, $5 \times 10^{-6}$ torr. The chromium may be evaporated from a first hot chromium-plated tungsten filament, after which the rhodium may be evaporated from a second, rhodium-plated tungsten filament by raising its temperature and without breaking the vacuum of the system. In another form at least the rhodium is evaporated using an electron beam instead of a heated filament. The chromium may be desposited to a thickness of, for example, 0.2 to 0.3 microns and the rhodium to a thickness of for example approximately 0.05 microns. During deposition the body 1 is heated in a conventional manner.

The chromium has good adhesion to both p-type and n-type silicon. Although not fully understood it is thought that some of the chromium may be oxidized by a thin silica layer naturally present on the silicon body and that this improves the adhesion of the chromium to the silicon. Such a thin silica layer is only tens of Aungstroms thick and naturally forms on exposure of the silicon to air at room temperature. The portion of the body 1 adjacent the back face 4 is sufficiently highly doped that the chromium layer 2 forms an ohmic contact to the silicon at this face 4.

The chromium which oxidizes readily and is unsolderable is protected against oxidation in the atmosphere by the thin outer layer 3 of rhodium. This protection may be due in part to the rhodium layer's resistance to diffusion of oxygen thus reducing the partial pressure of oxygen at the chromium-rhodium interface and also by reducing the chemical activity of the chromium at the interface by diffusion of rhodium atoms into the chromium surface. The outer rhodium layer 3 acts as a barrier to impurities diffusing to the chromium and the silicon back face. The rhodium is readily solderable.

After thus metallizing the back face 4 by evaporation of chromium and rhodium, the wafer comprising the large number of device elements is devided into the individual bodies 1 of each device element. This may be achieved by scribing and fracturing in a conventional manner. The Applicants have found that the production of satisfactory individual device bodies 1 by the fracturing operation is facilitated by having such a thin back-metallization 2, 3, compared with the thicker conventional silver-titanium back metallization.

Figure 2:
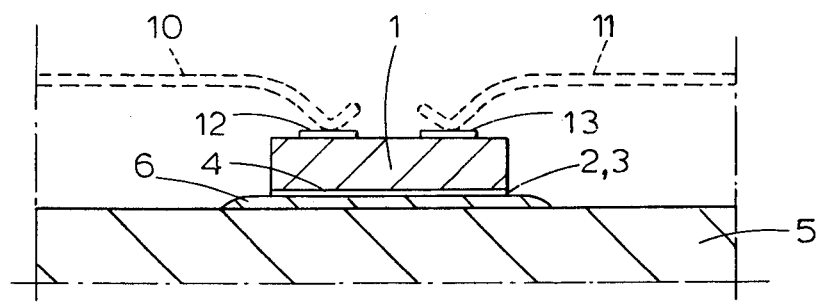
FIG. 2 is a cross-sectional view of part of a semiconductor device showing the semiconductor body of FIG. 1 secured on a supporting member.

FIG. 2 illustrates a subsequent stage in the manufacture of a semiconductor device, in which the body 1 of FIG. 1 is secured on an electrically and thermally conductive supporting member 5 by a solder film 6. The solder may be, for example, a soft solder alloy containing by weight 95.5% lead, 3.0% silver and 1.5% tin, and having a solidus of 294° C and a liquidus of 315° C. The solder 6 adheres well to member 5 and the rhodium layer 3 of the semiconductor body 1 to provide good mechanical, electrical and thermal connection between the member 5 and the whole metallized back face 4 of the body 1. Because the diffusion rate of rhodium in lead-rich solders is low at temperatures below 500° C, the very thin layer 3 of rhodium is quite adequate.

The supporting member 5 may be for example a copper conductor plated with nickel and then gold. Such a copper conductor may be part of a copper-sheet lead frame or lead comb or it may be, for example, a copper heat-sink disc on for example a steel base plate of a header such as a header of the TO-3 type outline. In another form, the supporting member 5 is of iron or KOVAR plated with gold; such a member 5 may be, for example, a header of the TO-5 type outline.

Figure 3:
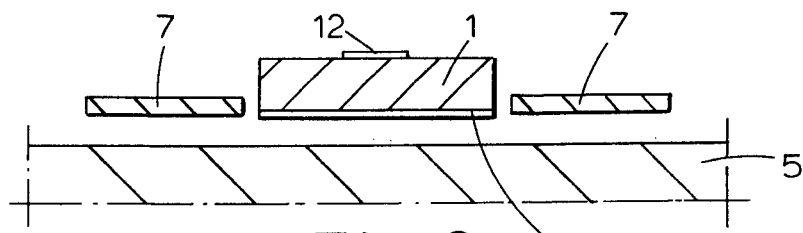
FIG. 3 is an exploded cross-sectional view of components shown in FIG. 2 taken normal to the cross-sectional view of FIG. 2 and at a state in manufacture using capillary-flow soldering.

The body 1 may be secured to the member 5 by soldering. FIG. 3 illustrates in exploded view the arrangement for capillary flow soldering as described in British Patent No. 1,331,980 (PHB 32111). Reference is invited to this Patent for specific details of capillary flow soldering techniques. The semiconductor body 1 and at least one body of solder material 7 are arranged beside each other in non-overlapping relationship on the surface of the supporting member 5; on heating to for example 380° C which is above the melting point of the solder, solder material flows from the solder body 7 to between the semiconductor body 1 and the member 5 to form the said solder film 6 securing the semiconductor body 1 to the member 5.

Figure 4:
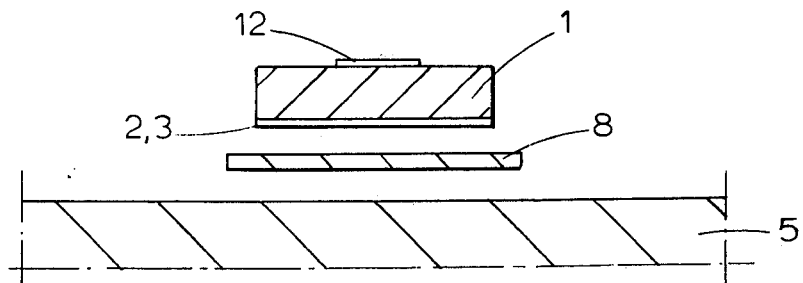
FIG. 4 is an exploded cross-sectional view of components shown in FIG. 2 taken normal to the cross-sectional view of FIG. 2 and at a stage in manufacture using either direct soldering or pressure-bonding.

An alternative arrangement is illustrated in FIG. 4. In this case, the semiconductor body 1 is arranged on a solder layer preform 8 on the supporting member 5. The arrangement of the semiconductor body 1 on the member 5 may then be heated to above the melting point of the solder material to solder the semiconductor body 1 to the member 5. However, instead of soldering, the semiconductor body 1 may be pressure-bonded to the member 5 via the solder layer 8 by placing the arrangement of the semiconductor body 1, intermediate solder layer 8 and member 5 in a press and at a temperature below the melting-point of the solder. More specific details of pressure-bonding techniques are given in published Dutch Patent Application 7208027 and to which reference is invited.

After securing the body 1 to the member 5, lead connections 10 and 11 are made to electrodes 12 and 13 at the front face of the body 1, see FIG. 2. The number and arrangement of these electrodes at the front face will depend on the type of device manufactured. When the body 1 is that of a single transistor or of a Darlington transistor pair, front electrode 12 and lead 10 may be an emitter connection, front electrode 13 and lead 11 may be a base connection, and the back metallization (2, 3) and supporting member 5 may form a collector connection.

In the embodiments so far described the semiconductor body 1 was of silicon, however such rhodium-chromium back metallization (2, 3) may be used for semiconductor devices comprising a semiconductor body of germanium.

For some semiconductor devices, for example diodes, it may be desirable to provide similar rhodium-chromium metallizatioan on both the front and back faces of the semiconductor body; it may even be desirable to bond a front contact to the front metallization via a solder film in the same operation as the back face 4 is bonded to the said supporting member 5 via a solder film 6.

We claim:

1. A method of mechanically, electrically and thermally bonding the back face of a semiconductor body to a supporting member, comprising the steps of:
    evaporating a thin layer of chromium onto the back surface of the semiconductor body;
    evaporating onto the chromium layer a thin layer of metal selected from the group consisting of rhodium, platinum, palladium and alloys thereof;
    fusing the metallized back surface of the semiconductor body to the supporting member with a solder film.

2. A method of mechanically, electrically and thermally bonding the back face of a semiconductor body to a supporting member, comrpising the steps of:
    evaporating a thin layer of chromium onto the back surface of the semiconductor body;
    evaporating onto the chromium layer a thin layer of rhodium;
    fusing the metallized back surface of the semiconductor body to the supporting member with a solder film.

3. A method as defined in claim 2 wherein the rhodium layer is less than half a micron in thickness.

4. A method as defined in claim 3 wherein the rhodium layer is less than a tenth of a micron in thickness.

5. A method as defined in claim 3 wherein the chromium layer is less than half a micron in thickness.

6. A method as defined in claim 2 wherein the solder material of the solder film is one of the soft solder materials having a melting point below 330° C.

7. A method as defined in claim 6 wherein the solder material consists essentially of lead, silver and tin, lead being the main constituent.

8. A method as defined in claim 2 wherein the metallized back surface is fused to the supporting member by capillary flow soldering.

9. A method as defined in claim 2 wherein the metallized back surface is fused to the supporting member by pressure-bonding via an intermediate solder film.

10. A method as defined in claim 2 wherein the supporting member comprises a ceramic substrate.

* * * * *

UNITED STATES PATENT AND TRADEMARK OFFICE
CERTIFICATE OF CORRECTION

PATENT NO. : 4,023,725
DATED : May 17, 1977
INVENTOR(S) : PETER ROBERT IVETT ET AL

It is certified that error appears in the above-identified patent and that said Letters Patent are hereby corrected as shown below:

Column 1, line 65, "undesirable" should be --undesirably--

Column 4, line 26, "state" should be --stage--

Signed and Sealed this twenty-third Day of August 1977

[SEAL]

Attest:

RUTH C. MASON
Attesting Officer

C. MARSHALL DANN
Commissioner of Patents and Trademarks